(12) United States Patent
Pourquier

(10) Patent No.: US 8,003,433 B2
(45) Date of Patent: Aug. 23, 2011

(54) PROCESS FOR FABRICATING A HIGH-INTEGRATION-DENSITY IMAGE SENSOR

(75) Inventor: Eric Pourquier, Voreppe (FR)

(73) Assignee: E2V Semiconductors, Saint-Egreve (FR)

( * ) Notice: Subject to any disclaimer, the term of this patent is extended or adjusted under 35 U.S.C. 154(b) by 127 days.

(21) Appl. No.: 12/518,456

(22) PCT Filed: Dec. 11, 2007

(86) PCT No.: PCT/EP2007/063664
§ 371 (c)(1),
(2), (4) Date: Jun. 23, 2009

(87) PCT Pub. No.: WO2008/074688
PCT Pub. Date: Jun. 26, 2008

(65) Prior Publication Data
US 2009/0275165 A1    Nov. 5, 2009

(30) Foreign Application Priority Data

Dec. 20, 2006    (FR) ...................................... 06 11082

(51) Int. Cl.
*H01L 31/18* (2006.01)
*H01L 27/146* (2006.01)
(52) U.S. Cl. ........ 438/98; 438/63; 438/64; 257/E27.141
(58) Field of Classification Search .................... 438/64, 438/98, 63
See application file for complete search history.

(56) References Cited

U.S. PATENT DOCUMENTS

| | | | |
|---|---|---|---|
| 6,809,008 B1 * | 10/2004 | Holm et al. | 438/455 |
| 2005/0035381 A1 | 2/2005 | Holm et al. | |
| 2005/0040316 A1 * | 2/2005 | Holm et al. | 250/208.1 |
| 2005/0247940 A1 * | 11/2005 | Shibata et al. | 257/66 |
| 2006/0043438 A1 | 3/2006 | Holm et al. | |
| 2006/0197007 A1 | 9/2006 | Iwabuchi et al. | |
| 2007/0166956 A1 * | 7/2007 | Blanchard | 438/459 |
| 2008/0290438 A1 * | 11/2008 | Weng et al. | 257/434 |
| 2009/0224161 A1 * | 9/2009 | Fritsch et al. | 250/370.09 |
| 2009/0263931 A1 * | 10/2009 | Blanchard | 438/98 |
| 2010/0314776 A1 * | 12/2010 | Blanchard | 257/774 |

* cited by examiner

*Primary Examiner* — Alexander G Ghyka
(74) *Attorney, Agent, or Firm* — Lowe Hauptman Ham & Berner, LLP

(57) ABSTRACT

The present application relates to the fabrication of an electronic component. The component comprises two, superposed integrated circuits: one of which is formed on the front side of a thinned first substrate, and the other of which is produced on the front side of a second substrate, with an insulating planarization layer interposed between the front sides of the two substrates. The silicon of the backside of the thinned substrate is opened locally above a first conducting area located in the thinned substrate and above a second conducting area located in the second substrate. A conducting layer portion, deposited on both areas, electrically connects them so as to provide the interconnection between the two circuits. The external connection pads may also be formed in this conducting layer.

20 Claims, 7 Drawing Sheets

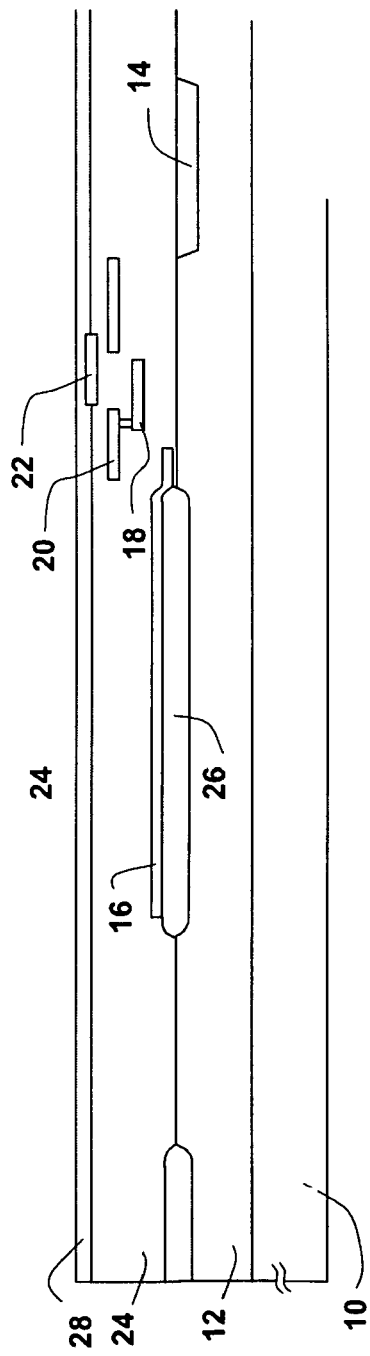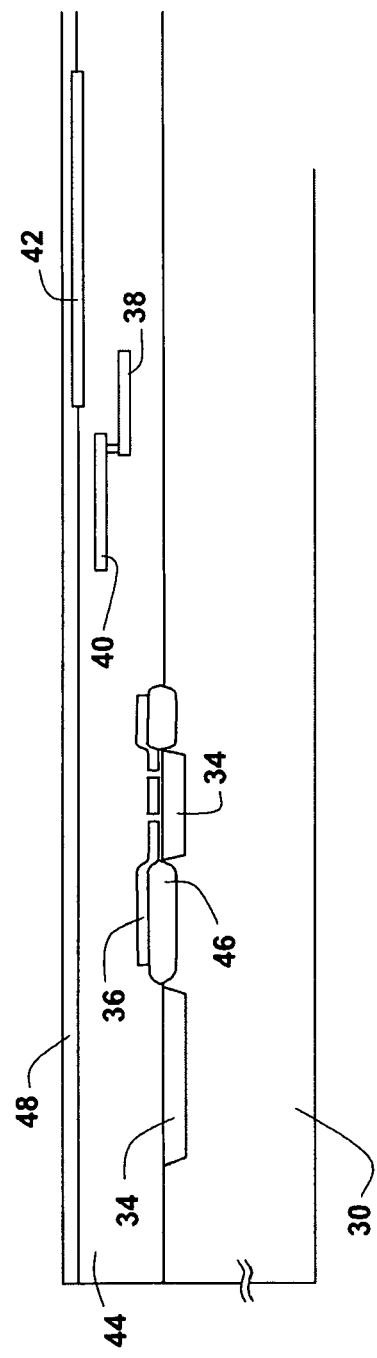

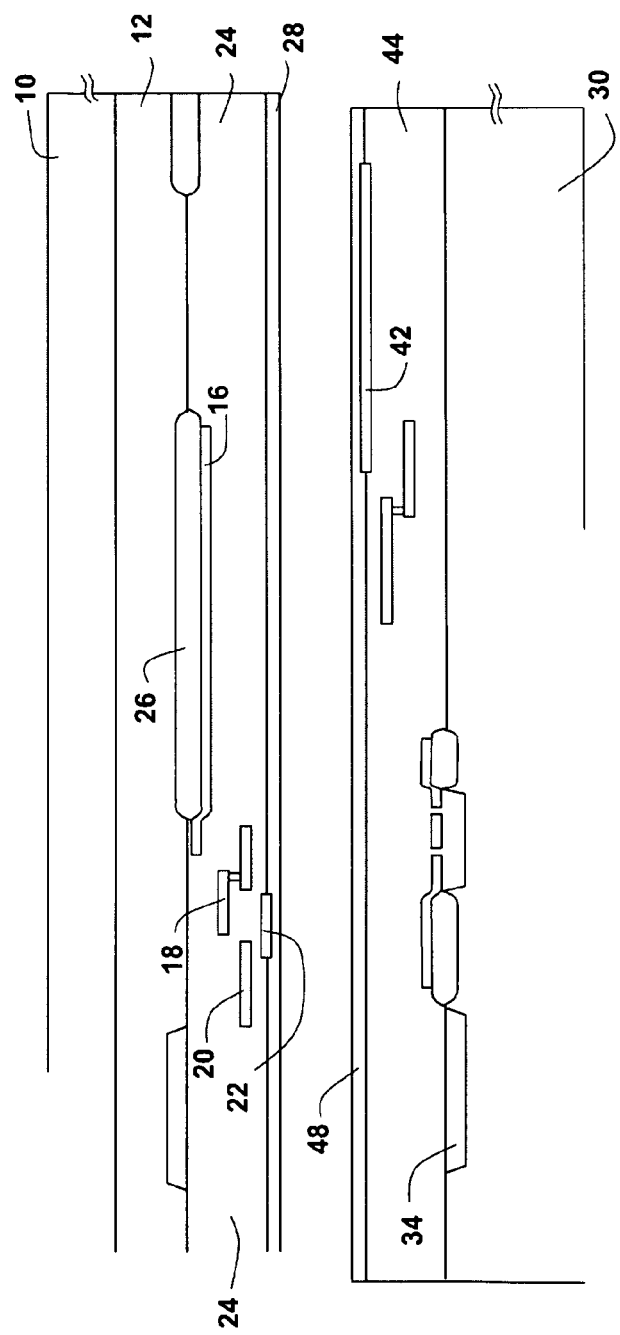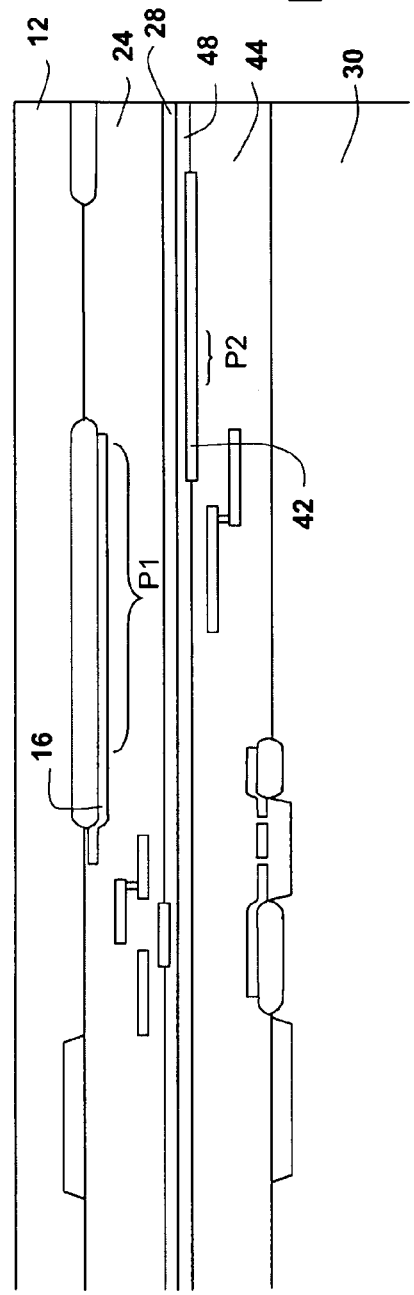

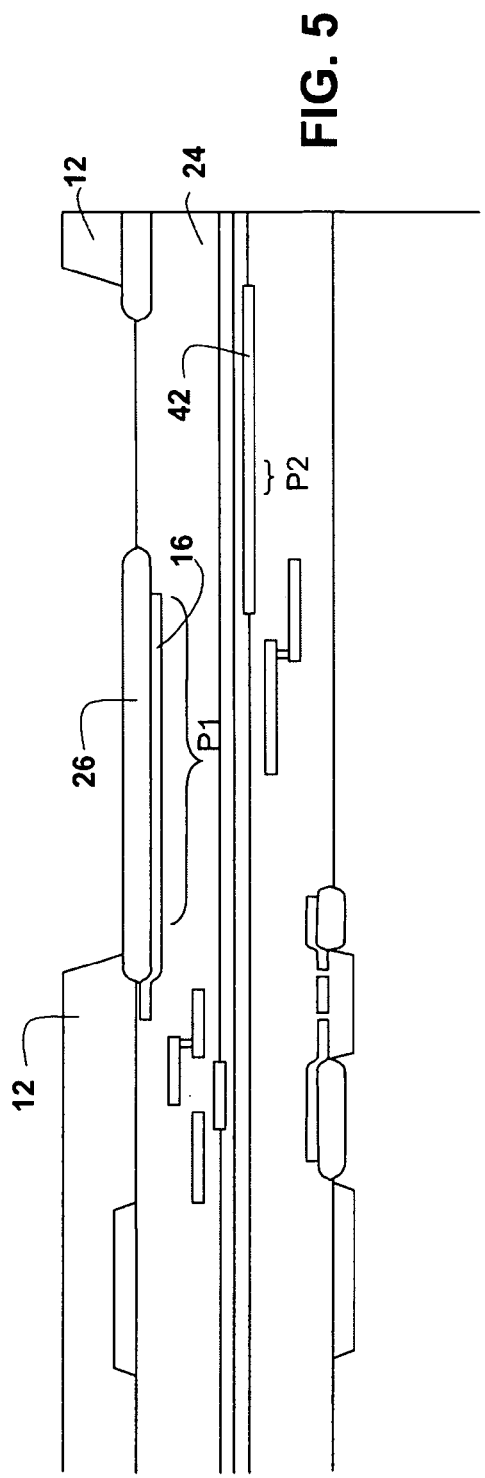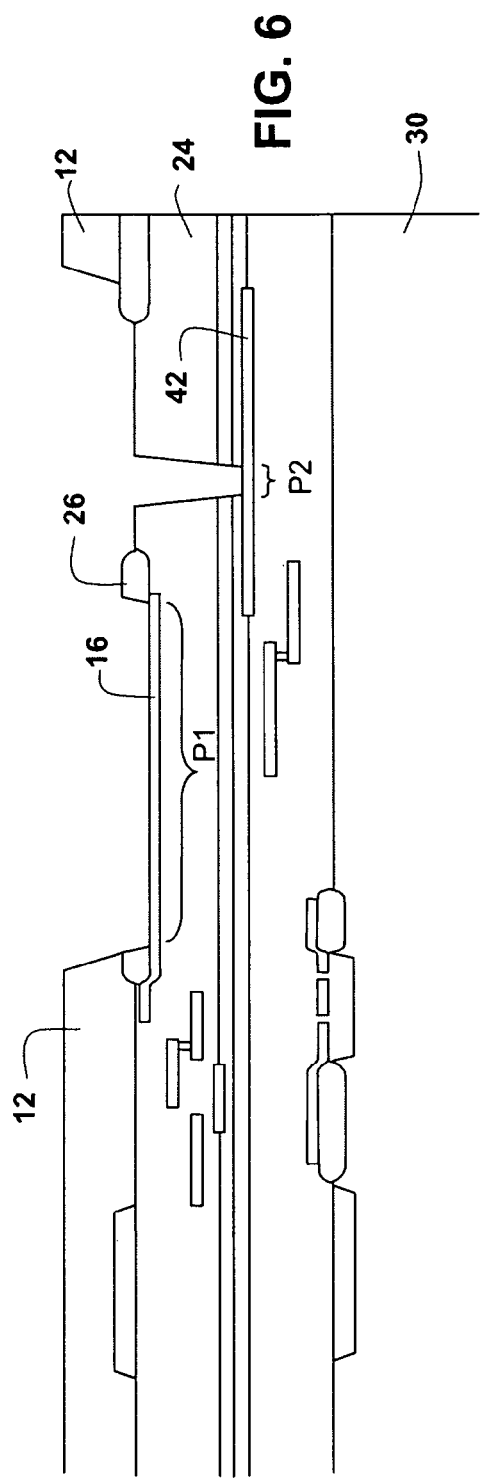

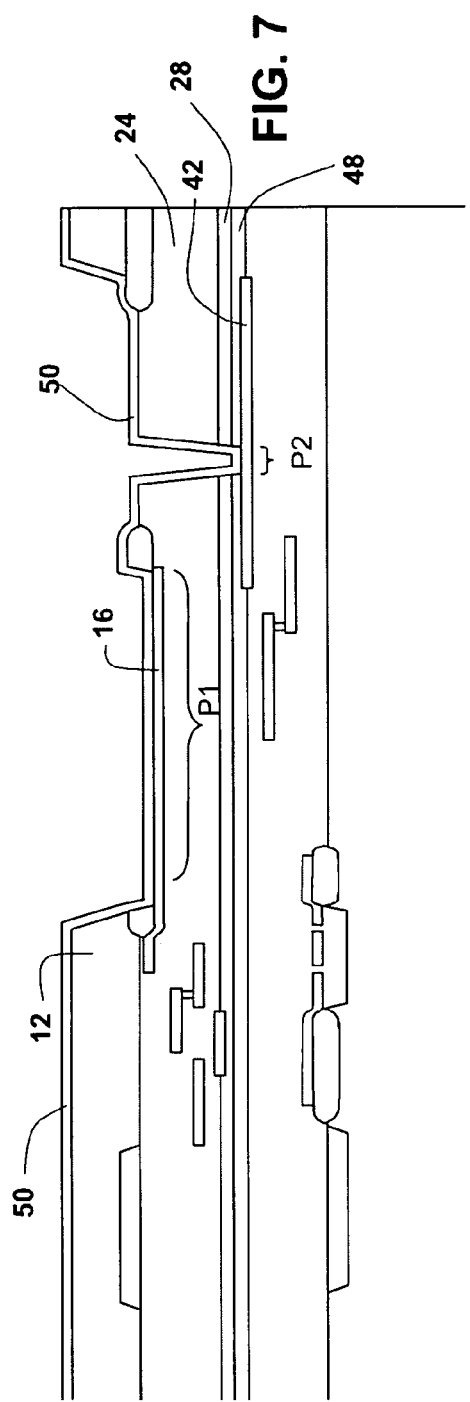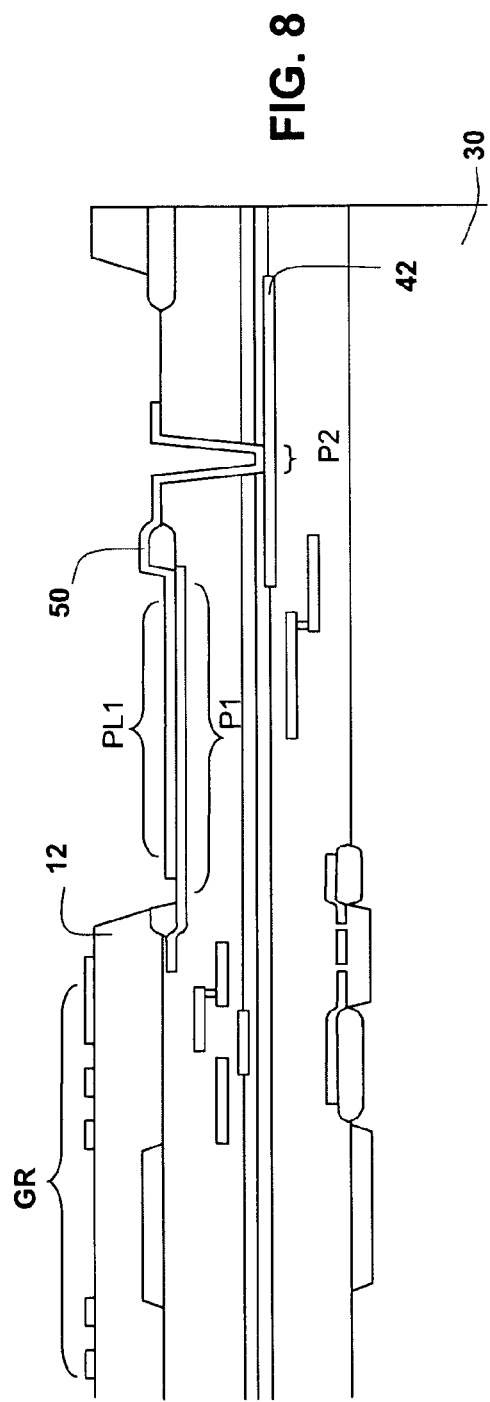

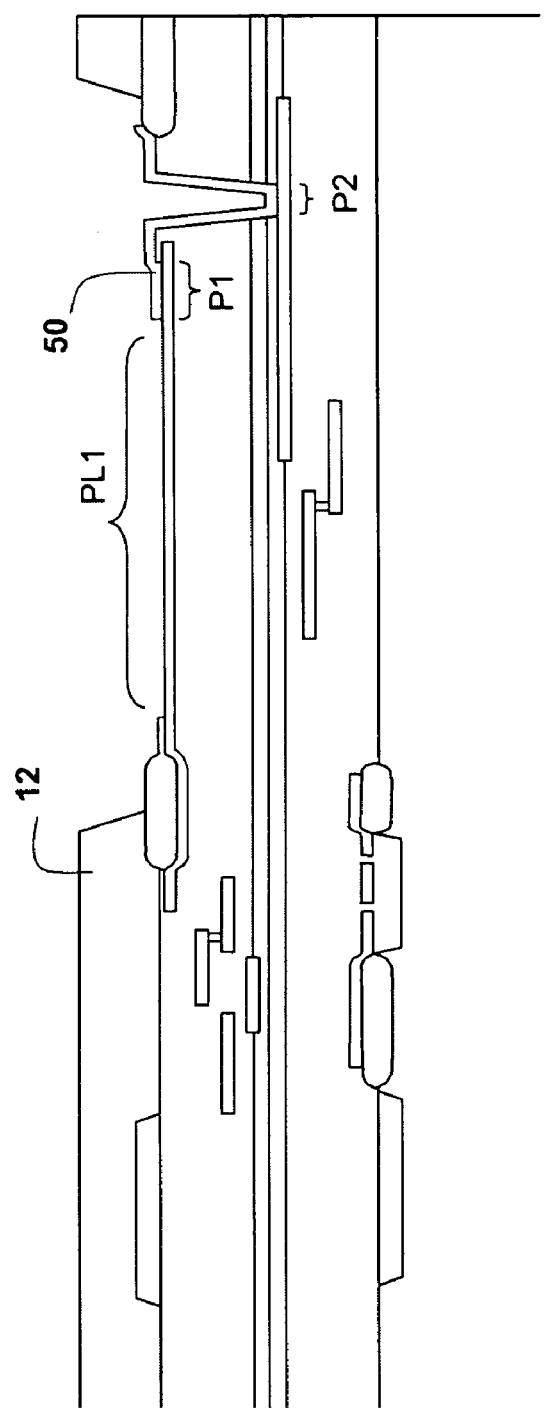

PROCESS FOR FABRICATING A HIGH-INTEGRATION-DENSITY IMAGE SENSOR

CROSS-REFERENCE TO RELATED APPLICATIONS

The present application is based on International Application No. PCT/EP2007/063664, filed on Dec. 11, 2007, which in turn corresponds to French Application No. 0611082, filed on Dec. 20, 2006, and priority is hereby claimed under 35 USC §119 based on these applications. Each of these applications are hereby incorporated by reference in their entirety into the present application.

FIELD OF THE INVENTION

The invention relates to the fabrication of electronic image sensors with a very high integration density and notably to an image sensor on a thinned silicon substrate.

BACKGROUND OF THE INVENTION

Image sensors on a thinned substrate have been designed to improve the calorimetric performance of the sensors while enabling the sensors to be illuminated via the backside of a very thin silicon layer. This arrangement prevents the dispersion of photons and electrons photogenerated in the substrate and therefore prevents optical crosstalk which would greatly impair the calorimetric performance since neighboring image pixels correspond to different colors.

The fabrication of an image sensor on a thinned substrate generally comprises the following steps, beginning with a normal silicon substrate a few hundred microns in thickness, allowing industrial-scale handling of wafers of about ten to twenty centimeters in diameter, this substrate being coated on the front side with an epitaxial layer of single-crystal silicon, possibly isolated from the rest of the substrate by an oxide layer in the case of SOI (silicon-on-insulator) substrates. The electronic circuitry necessary for the various functions of the sensor (essentially image acquisition) is produced on the front side of this single-crystal layer. Next, the substrate is bonded, via its front side that bears this circuitry, to a transfer substrate of sufficient thickness for industrial handling, and the initial silicon substrate is thinned down to a thickness of a few microns. The resulting very thin silicon thickness precludes industrial handling of the wafer, this being the reason for the presence of the bonded transfer substrate.

The signals coming from the electronic image acquisition component thus produced are in general exploited by other electronic devices that do not form part of the component.

To increase the complexity of the tasks accomplished by the electronic image acquisition component without increasing the size (and therefore the cost) of the thinned sensor itself, it would be desirable to combine an auxiliary electronic circuit with the thinned sensor in a way that minimizes the footprint and optimizes the industrial production process. One solution envisioned by the present invention is to bond two integrated circuits face to face, one circuit being the thinned image sensor and the other being an integrated electronic circuit electrically connected to the thinned sensor.

The problem of electrically connecting the two circuits is however not easy to solve. One solution that seems to be appropriate consists in using the flip-chip connection technique in which the sensor (before being thinned) has external metal connection pads, and the facing integrated circuit has metalizations exactly opposite them, indium balls being provided on the metalizations of one of the two circuits. By reflow of the indium balls, the sensor and the auxiliary integrated circuit are soldered together, pad to pad. This is necessarily done before the sensor is thinned, and the soldering must be carried out during the wafer-scale process on entire silicon wafers, that is to say before they are diced into individual integrated-circuit chips, both as regards the sensor and the associated integrated circuit.

Besides the fact that it is not easy to produce these pads of the thinned sensor, it is also necessary to provide pads for the connection to the outside of the assembly formed by the thinned sensor and its associated integrated circuit. This is because the pads of the sensor that served for soldering the two wafers face to face are no longer accessible.

Furthermore, when soldering in this manner, there are operations that can no longer be carried out on the backside of the thinned sensor, in particular if these operations require high treatment temperatures incompatible with the presence of indium solder joints.

Moreover, patent publication US 2006/0043438 teaches a process for combining a thinned sensor with a CMOS integrated circuit substrate. This process requires operations (notably to form openings in the silicon and to refill them with oxide) on the sensor before it is thinned, so as thereafter to be able to make a connection by copper plugs in the zones thus prepared.

SUMMARY OF THE INVENTION

The invention therefore provides a fabrication process improved from the standpoint of simplicity producing an electronic component that combines both an image sensor on thinned silicon and an associated integrated circuit.

More precisely, the invention provides a process for fabricating an electronic component comprising an image sensor on a thinned substrate and an associated integrated circuit, comprising the following operations:

the image sensor is produced from the front side of a first substrate made of semiconductor material, the sensor comprising first conducting areas intended for establishing contacts with corresponding second conducting areas of the associated integrated circuit;

the associated integrated circuit, with its second conducting areas, is produced on the front side of a second substrate, the second conducting areas of the second substrate not being covered by other conducting layers of the first or of the second substrate when the two substrates are superposed in their definitive positions;

the two substrates are bonded together front side to front side;

the first substrate is thinned down to a thickness of about 2 to 30 microns;

the semiconductor material of the thinned first substrate is locally etched over its entire thickness above the first conducting areas and above the second conducting areas;

the first areas and the second areas are locally stripped by removing the insulating layers that cover them;

a conducting layer is deposited that comes into contact with the first and second stripped areas; and the conducting layer is etched so as to define individual electrical connections between a first area of the image sensor and a second area of the associated integrated circuit.

The two substrates are preferably bonded together by direct wafer bonding (molecular adhesion) i.e. without addition of adhesive, the front sides of the two substrates being planarized before bonding.

The etching operation for baring the areas may be carried out in one or two steps, depending on the nature of the layers that are to be etched. This is because the step of baring the areas of the sensor on a thinned substrate may comprise etching several insulating layers, whether these be deposited or thermally formed, whereas the step of baring the areas of the associated circuit also comprises etching other layers, for example the planarization layers of the two front sides. The two etching operations are therefore not necessarily the same, even if very often most of the insulating layers are of the same nature, notably based on silicon oxide.

The first conducting contact area may be connected directly to an external connection pad of the electronic component, which pad may or may not form part of the same conducting layer as the contact area.

The connection pad may come into contact over most of its surface with the first conducting area or instead be laterally offset relative to the first conducting area.

The opening in the thinned substrate above a first conducting area and above a second conducting area intended to be electrically connected to the first may comprise either a single common opening above the two areas, or two different openings separated laterally from each other.

Preferably, the image sensor is a sensor on thinned silicon, intended to illuminated via its backside, and the associated integrated circuit may be an image processing circuit.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIG. 1 shows an image sensor before thinning;

FIG. 2 shows the associated integrated circuit before the transfer of the image sensor;

FIG. 3 shows the step of placing the sensor so that it faces the associated integrated circuit;

FIG. 4 shows the assembly consisting of the sensor and the associated circuit, the substrate of the sensor being thinned after the two substrates have been bonded together;

FIG. 5 shows the step of etching an opening in the thinned silicon;

FIG. 6 shows the step of baring the conducting areas to be connected together;

FIG. 7 shows the deposition of a conducting layer on the backside of the thinned sensor;

FIG. 8 shows the etching of the conducting layer for the formation of connections between the sensor and the associated integrated circuit, and the optional formation of external connection pads of the component;

FIG. 13 shows another embodiment in which the conducting area of the image sensor and the external connection pad for the component form part of the same layer.

DESCRIPTION OF PREFERRED EMBODIMENTS

Figure 9:
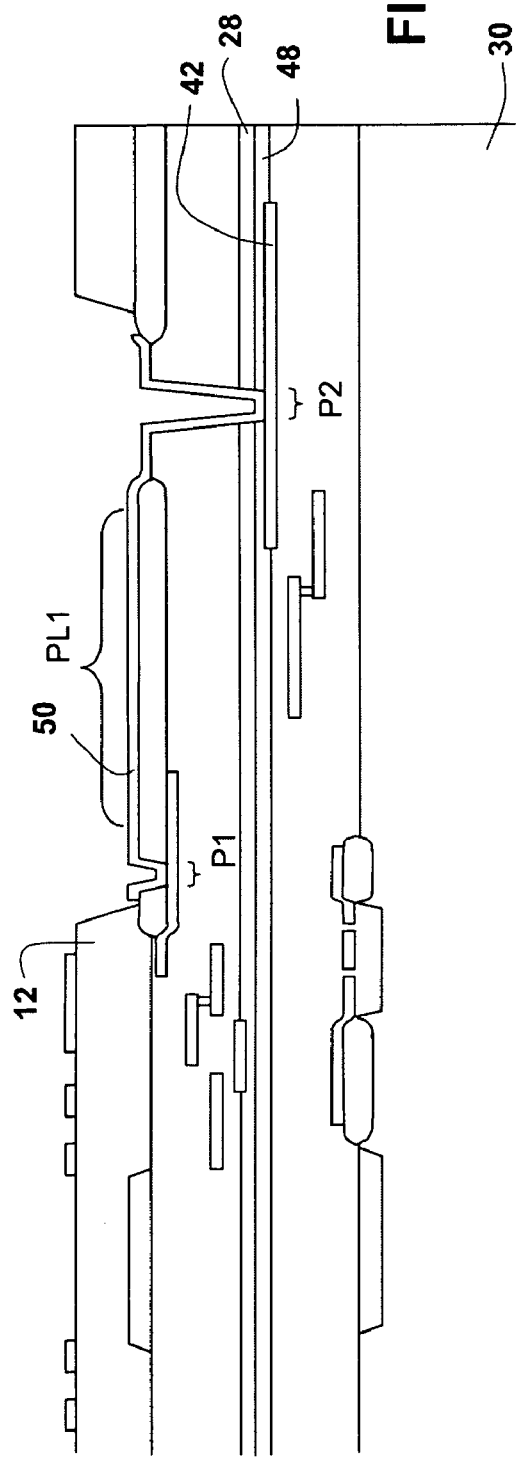
FIG. 9 shows an alternative embodiment of the electronic component according to the invention.

The invention will be described with regard to an image sensor on silicon, illuminated by its thinned backside, for image acquisition in the visible range of wavelengths to which the silicon is sensitive. However, the invention is applicable to sensors on substrates made of other materials and for other wavelengths (for example infrared).

FIG. 1 shows a silicon substrate 10 having an epitaxial surface layer 12 in which the active elements of the integrated circuit, and notably the photosensitive elements of the image sensor, will be produced. The electronic circuits of the sensor, comprising for example a photosensitive active matrix and peripheral circuits, are fabricated by conventional operations of depositing, etching and doping various insulating, conducting or semiconductor layers, and all these operations are carried out via the front side of the substrate, namely that side on which the epitaxial layer (the uppermost side in FIG. 1) is located. The substrate 10 may be a bulk single-crystal silicon substrate or an SOI (silicon-on-insulator) type substrate comprising an epitaxial layer separated from the substrate by a thin silicon oxide layer.

The figures have not been drawn to scale, whether as regards thicknesses or as regards widths, so as to simplify the representation. The thickness of the substrate 10 is several hundred microns, this being sufficient for the silicon wafers, on which multiple individual sensors will be collectively formed, to undergo industrial handling. At this stage therefore, the substrate 10 is a silicon wafer, and it is only later that the substrate will be divided up into individual components.

Technology used to produce the sensor may be a CMOS technology in which not only the peripheral circuits but even the pixels of the photosensitive matrix are produced from MOS transistors.

Not all the steps for producing the sensor in this technology will be described, given that only the steps of connecting the sensor to another integrated circuit associated therewith form the subject of the present invention, but the figures show examples of layers that may be in the sensor so as to make it easier to understand the invention.

Thus, FIG. 1 shows symbolically, on the front side of the substrate, the epitaxial layer 12 with a doped semiconductor zone 14, and above the epitaxial layer 12, several superposed levels of conducting layers 16, 18, 20, 22 that are separated from one another by the insulating layers. The conducting layers are etched according to desired features dictated by the functionality of the circuit, which layers may be connected in places to one another by conducting vias through the insulating layers. The insulating layers are denoted overall by the reference 24 without any distinction between them, although they are successively deposited and etched as alternating conducting layers and insulating layers.

The first conducting level 16 may be deposited in places on a relatively thick insulator layer 26 (order of magnitude of the thickness: 1 micron) formed by deposition or by thermal oxidation of the silicon. The conducting level 16 may also be deposited on a thinner insulating layer, deposited or formed by thermal oxidation of the silicon.

In general, the various conducting levels may mainly be aluminum-based. The insulating layers may notably be made of silicon oxide and/or silicon nitride. The inter-level connections may be made by vias through the insulating layers, these vias possibly being filled with conducting material, such as tungsten.

Other conducting layers, such as polycrystalline silicon layers, may be present, for example for forming the gates of MOS transistors, and other diffusions of n-type or p-type may be provided (for the sources and drains of transistors, photodiodes, etc.). They have not been shown.

All these layers are formed via the front side of the silicon substrate during the wafer-scale fabrication steps.

At the end of the front-side fabrication steps, the sensor is therefore overall in the form of a silicon substrate 10 coated with an epitaxial layer 12 notably including differently-doped features, this epitaxial layer itself being coated with an insulating layer 24 in which several etched conducting levels are embedded.

An insulating planarization layer 28 is then deposited on the front side so as to end up with a perfectly planar front side, not having the microreliefs that the preceding deposition and etching steps may generate. Preferably, the planarization layer 28 is made of inorganic material (for example silicon oxide or silicon nitride) so as to withstand subsequent processing temperatures that may be high.

At this stage, no specific operation has been carried out for preparing the connection of the thinned sensor to an integrated circuit; put simply, the conducting layers 16, 18, 20 and 22 are designed in such a way that a conducting layer with which a connection will be made subsequently to the integrated circuit does not cover another conducting layer at the point where the connection has to be established. This is because, in order for the connection with a conducting layer to be possible, the conducting layer is separated from the substrate at the connection point only by insulating layers 24. If the conducting layer serving for the connection is the first conducting level 16, there is no particular precaution to taken in the design.

The integrated circuit which will be combined with the sensor so as to form a hybridized electronic component having two chips bonded together is also produced, again by a wafer-scale fabrication process. In FIG. 2, this integrated circuit comprises layers similar to those of the sensor of FIG. 1. Again shown symbolically is a silicon substrate 30 on which are formed, from the front side, diffused zones 34, superposed conducting levels 36, 38, 40, 42 separated by a number of insulating layers 44, and thick oxide zones 46. The conducting layers are preferably aluminum-based and the insulating layers are preferably made of silicon oxide and/or silicon nitride. Finally, an insulating planarization layer 48 is deposited on the front side so as to make any microreliefs disappear. This planarization layer is also preferably made of inorganic material, such as silicon oxide or silicon nitride.

Here again, there is no prior particular step to be carried out but the design of the conducting layers must allow a layer serving for a connection to the thinned sensor not to be covered with another conducting layer at the point where the connection has to be made. If the conducting layer that has to serve for the connection is the final conducting level 42, there is no particular precaution to be taken.

Here again, the thickness of the substrate 30 (a silicon wafer) is several hundred microns so as to allow the wafer to undergo industrial handling during the wafer-scale fabrication of multiple integrated circuits which will be associated with the multiple image sensors.

The dimensions of the sensor chip and of the integrated-circuit chip may be exactly the same (without this being obligatory), as it is unnecessary, as will be seen later, to make one chip overhang the other so as to leave space for connection pads to the outside of the component.

The integrated features of the chip and the integrated features of the associated integrated circuit must be designed in such a way that conducting areas of one chip are precisely located with respect to areas of the other chip, for the purpose of connecting them together by the method that will now be described.

FIG. 3 shows the substrate 30 of the associated integrated circuit above which the substrate 10 of the image sensor is placed, the front side of said substrate 10 facing downward. The substrates are therefore placed front side to front side, the planarized layers 28 and 48 facing each other.

The two semiconductor wafers are precisely aligned one with respect to the other. They are then applied against each other and bonded together simply by direct bonding (molecular bonding). The phenomenon of molecular bonding derives from a very high attractive force created between two surfaces applied against each other whenever these surfaces are highly planar, i.e. devoid of any roughness. This is why the steps for fabricating the sensor and the associated integrated circuit include a planarization step. The planarization is carried out by the deposition of insulating material, preferably silicon oxide, followed by CMP (chemical-mechanical polishing).

Molecular bonding has the advantage of not requiring the addition of a bonding material, and in particular it avoids the use of organic adhesives that do not easily withstand the fabrication steps that will follow.

FIG. 4 shows the wafers bonded together in this way without addition of material between the insulating planarization layers 28 and 48. The bonding is followed by a step in which the substrate 10 of the sensor is thinned so as to retain only a very small thickness of silicon, in practice the thickness of the epitaxial layer 12 in which the n-type or p-type diffusions (such as 14) necessary for operation of the sensor have been formed. FIG. 4 shows the bonded wafers after this thinning step.

The thinning operation is carried out by machining, for example a mechanical lapping operation, followed by mechanical and/or chemical polishing.

The remaining thickness of silicon is extremely small (for example 3 to 5 microns for a sensor in CMOS technology, slightly more for a CCD sensor, and more for sensors that are sensitive to infrared wavelengths than for sensors that are sensitive to visible light). The invention is particularly advantageous when the substrate is thinned down to less than 10 microns of semiconductor material, because it is then easy to cut openings in a very thin substrate by conventional lithography processes and to deposit a conducting metal in these openings.

It will be understood that the following wafer-scale fabrication steps are possible only through the fact that the substrate 30 of the associated integrated circuit now serves as support for ensuring mechanical integrity of the image sensors that were formed on the substrate 10.

The front side of the sensor and the front side of the associated integrated circuit are now inaccessible, since the substrates 10 and 30 have been bonded together via their front sides. Various processing operations are carried out via the backside of the epitaxial layer 12 (at the top in FIG. 4), and notably the operations necessary for electrically connecting each sensor to the associated integrated circuit located below and, preferably simultaneously, the operations needed to produce connection pads for connecting the circuit to the outside.

In FIG. 4, P1 denotes a conducting contact area forming part of one of the conducting layers formed on the sensor during the front-side fabrication steps. In this example, the area P1 is part of the layer 16 that was initially formed on a thick thermal silicon oxide layer 26. The area is therefore located, in FIG. 4, beneath this oxide layer 26 since the substrate 10 was inverted, with its front side downward.

The area P1 of the sensor will serve for connection to a corresponding conducting area P2 of associated integrated circuit. Preferably, the area P1 forms part of the first metallization level in the process for fabricating the sensor, and the area P2 forms part of the final metallization level in the process for fabricating the associated integrated circuit. The area P2 is therefore formed here in a conducting layer 42.

The area P2 is not overlapped by the area P1 and in addition is not overlapped by any conducting layer portion of the sensor or of the associated integrated circuit.

The fabrication process steps that come after the bonding of the two substrates by direct wafer bonding comprise the following operations described with reference to FIGS. 5 to 8.

Firstly (FIG. 5), the silicon of the epitaxial layer 12 is etched over its entire thickness above the area P1 and above the area P2. The etching is carried out using an etchant that does not etch the insulating layers 24 or 26. In the example shown in FIG. 5, the silicon is opened over an entire zone encompassing both the area P1 and the area P2.

This opening bares the thick oxide layer 26 on which the conducting layer 16 had been deposited. If the conducting layer 16 had been deposited on another insulating (thin oxide or silicon nitride) layer, it would be this other layer that is bared. The opening in the silicon also bares the insulating layer 24 above the area P2. It will be recalled that the insulating layer 24 is in fact a superposition of insulating layers that were deposited so as to isolate the superposed conducting layers 16 to 22 from one another. There are no conducting layer portions above the area P2.

Next (FIG. 6), the insulating layer 26 is locally etched, through a resist mask, throughout the area P1 that it is desired to bare. An etchant is used that etches neither the silicon nor the conducting layers. The insulating layer 24 is also etched over its entire depth, as is the planarization layer 28, the planarization layer 48 and the optionally subjacent layers, down to the conducting layer 42. These etching steps locally bare the layer 16 (in the area P1) and the layer 42 (in the area P2). They may be carried out in a single operation through a resist mask open above the area P1 and the area P2, or else in two operations through two different masks each corresponding to one of the openings, or else in two operations through a mask open above the areas P1 and P2 and another mask open only above the area P2. The etching steps carried out in the area P2 may require several successive etchants if the layers 24, 28 and 48 cannot be etched by a single etchant.

Next (FIG. 7), a conducting layer 50, which may notably be made of aluminum or copper, is deposited so as to cover the entire backside of the sensor and come into contact with the stripped area P1 and with the stripped area P2.

Next (FIG. 8), the conducting layer 50 is etched so as to define, over the entire sensor, the interconnects to be established between a contact area P1 of the sensor and a contact area P2 of the associated integrated circuit and, at the same time, to define other possible uses of the conducting layer 50. These other uses notably include the formation of connection pads and the formation of an optical masking grid on the backside of the photosensitive matrix of the image sensor.

FIG. 8 shows an electrical connection established by the conducting layer 50 between the area P2 and the area P1, the layer 50 covering the area P1 throughout a zone the size of several tens of microns so as to constitute an external connection pad PL1 of the component. The connection pad is therefore formed in this example by a portion of the connection layer 50 and the pad is in contact over its entire surface or at the very least over most of its surface with the subjacent conducting area P1. A connection wire may then be bonded to this zone PL1 during encapsulation of the component.

Also shown in FIG. 8 is part of the layer 50 that may remain, after etching, to the rear of the epitaxial layer 12. This part layer GR may have an aperture grid configuration, allowing light to pass through onto the pixels of the photosensitive matrix of the sensor and enabling a reference potential to be applied to the rear of the epitaxial layer. This part layer GR is then connected for example to a ground connection pad of the component.

It is important to note that the metal layer 50 that remains after etching must not get back onto the silicon 12 of the active parts of the sensor (except as regards possibly the ground connection). This is because, given that the process according to the invention is particularly simplified in terms of the operations prior to the thinning, it may be seen that the silicon semiconductor of the active parts of the sensor is bared on the sidewalls of the openings and the connection should not come into direct contact with the silicon.

FIG. 9 shows an embodiment in which the size of the area P1 is much smaller than the size of the external connection pad PL1. The connection pad PL1 formed in the layer 50 therefore rests on the oxide layer 26 and only a small opening is formed in this oxide layer in the step shown in FIG. 6, in order to allow the connection layer 50 to come into contact with the area P1.

Figure 10:
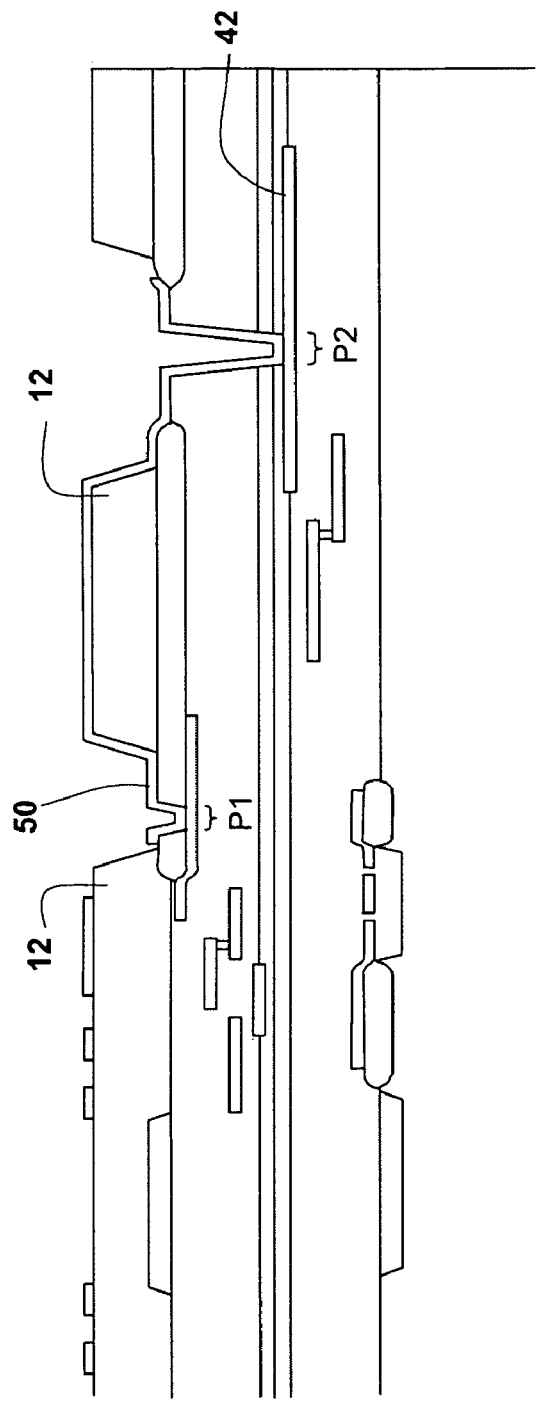
FIG. 10 shows one possible configuration with two openings in the silicon, above a conducting area of the sensor and above a conducting area of the associated circuit respectively.

FIG. 10 shows a configuration in which a contact internal to the component is established between an area P1 of the sensor and an area P2 of the associated integrated circuit, without this contact being associated with an external connection pad. There is therefore no zone PL1 associated with the two contact areas P1 and P2. In an electronic component produced according to the invention, there may equally be connections associated with external connection pads and connections not associated with a connection pad.

Whether or not there is an external connection pad, it may be desirable to minimize the dimensions of the opening cut into the epitaxial layer in the step shown in FIG. 5. FIGS. 1 to 9 show a single opening that encompasses both a contact area P1 (even an external connection pad PL1) and a contact area P2. However, two separate openings may be provided, one above the contact area P1 and the other above the contact area P2, the conducting layer 50 that connects these two areas passing above the silicon 12 that separates these two openings. However, this silicon part that separates the two openings must then be entirely isolated from the rest of the silicon layer bearing the photosensitive elements, unless the connection is a connection to the ground potential. This is the situation shown in FIG. 10, which is particularly applicable in the case in which there is no external connection pad since openings of small dimensions may then be made in the silicon, but which is also applicable when there is such a pad. It is also possible through this system to connect an area P1 of the sensor to an area P2 of the associated integrated circuit even if these areas are not very close to each other on the component. For connection routing reasons, it will be preferable, however, to arrange for an area P1 to be very close to an area P2 to which it has to be connected.

In general, the electrical contacts between sensor and associated integrated circuit will instead be produced on the periphery of the integrated-circuit chips, most particularly if there is an associated external connection pad, but the principle of the invention is applicable in the case of contacts located anywhere in the surface of the two circuits whenever space is available therefor.

Figure 11:
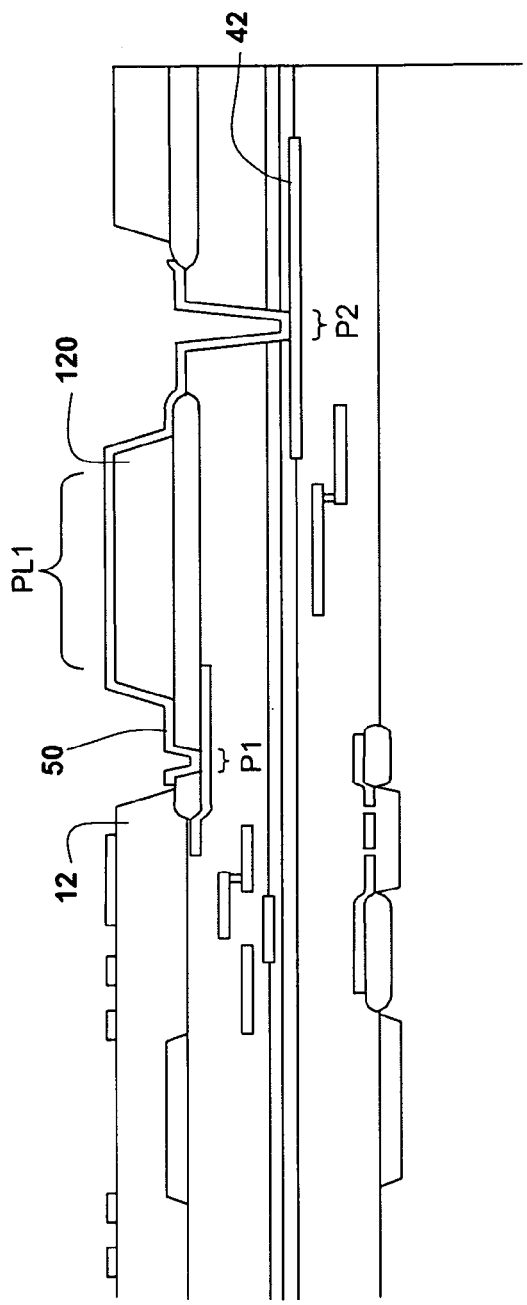
FIG. 11 shows an alternative embodiment of the component.

FIG. 11 shows another configuration inspired by FIG. 10, i.e. in which the opening formed in the layer 12 for the area P1 is separate from the opening for the area P2. However, unlike FIG. 10, a contact pad has been provided, which is located on the backside of the single-crystal silicon layer 12 and not in an opening cut into this layer. Measures are taken to ensure, in this case, that the pad PL1 is entirely surrounded by an open peripheral trench in the silicon 12. The pad PL1 is thus formed on a silicon island 120 isolated from the rest of the silicon layer 12—the portion of metal layer 50 which forms the pad and is in contact, on the one hand, with the area P1 and, on the other hand, with the area P2, is in contact with the silicon of the island 120 but is not in contact with the rest of the silicon layer 12 (unless this is a ground pad intended for setting the potential of this layer).

Figure 12:
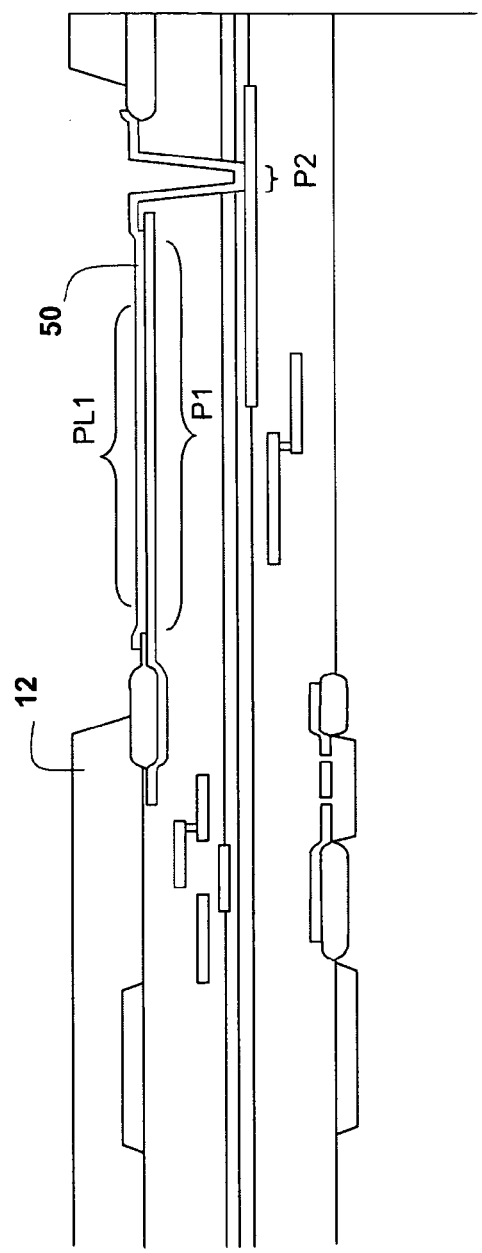
FIG. 12 shows an embodiment in which the connection pad is formed on the backside of the single-crystal silicon layer and not at the bottom of a bowl cut out in the silicon.

FIG. 12 shows an embodiment variant of FIG. 8, in which the contact area P1 formed in the conducting layer 16 does not lie beneath a thick (LOC/OS or other) oxide layer but beneath a very thin insulating layer (with the thickness of an MOS transistor gate oxide or a charge-transfer gate oxide). The principle of the invention is not modified, the insulator etching step of FIG. 5 being simplified because of the small thickness to be etched (in practice it may be enough just to remove the insulator by unmasked chemical etching).

FIG. 13 shows an embodiment variant of FIG. 11, which is also applicable to FIG. 8, i.e. independent of the fact that the insulating layer 26, beneath which the conducting layer 16 is located, is thin or thicker. In this embodiment, the external connection pad PL1 forms part of the same conducting layer 16 as the area P1—it is not the layer 50 that serves to form the pad PL1. The layer 50 therefore covers only a small part of the layer 16, and it is this small part that constitutes the contact area P1. A wide portion of the layer 16 also constitutes the external connection pad PL1. Consequently, in this embodiment, provision is made for insulation etching of the step described in FIG. 6 to bare not only the contact area P1 but also an entire zone, whether adjacent to the area P1 or not, corresponding to the pad PL1 to be produced.

FIGS. 8 to 13 show a few examples of the structure of an electronic component according to the invention at an almost final fabrication stage.

The last fabrication steps (not shown) include a passivation step consisting in covering the backside with a protective insulating layer and in opening this layer opposite the external connection pads, such as PL1. However, it should be pointed out that such a passivation step could be carried out before the conducting layer 50 has been deposited, and even before the thick oxide layer 26 and the insulating layers 24, 28 and 48 have been opened, and therefore between the step shown in FIG. 5 and the step shown in FIG. 6. The step of baring the conducting contact areas then includes, of course, an operation for locally removing the passivation layer.

There then remains to install the color filters for a color image sensor.

Finally, the semiconductor wafer is diced into individual chips, each comprising an image sensor on a thinned substrate, with backside illumination, superposed with an associated integrated circuit chip in which the sensor is electrically connected directly. The dicing operation is conventional, for example a sawing operation, and it poses no particular problem.

The conventional encapsulation steps are then carried out, for example for mounting a chip in a package and for bonding connection wires between the connection pads PL1 and the package.

The image sensor has been described as being a sensor on a silicon substrate intended to be illuminated via its backside, the silicon being the material most often used for image sensors in the visible light range, and particularly the color image sensors. However, the invention is applicable to image sensors formed on other materials, for image acquisition in other wavelength ranges (notably infrared, ultraviolet and X-ray ranges). The substrate may for example be made of gallium arsenide or HgCdTe.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A process for fabricating an electronic component comprising an image sensor on a thinned substrate and an associated integrated circuit, said process comprising the following operations:

producing the image sensor from the front side of a first substrate made of semiconductor material, the sensor comprising first conducting areas arranged for establishing electrical contacts with corresponding second conducting areas of the associated integrated circuit;

producing the associated integrated circuit, with the second conducting areas of the associated integrated circuit, on the front side of a second substrate, the second conducting areas of the second substrate being arranged not being covered by other conducting layers of the first or of the second substrate when the first and second substrates are superposed;

bonding the first and second substrates together front side to front side after formation of the image sensor and the associated integrated circuit;

thinning the first substrate down to a thickness of about 2 to 30 microns after the bonding of the first and second substrates;

etching the semiconductor material of the thinned first substrate to form one or more openings, the one or more openings being over at least a portion of the first conducting areas and the second conducting areas;

removing at least a portion of insulating layers over the first conducting areas and the second conducting areas to at least partially expose the first conducting areas and the second conducting areas after the removal of the semiconductor material of the thinned first substrate;

depositing a conducting layer that comes into contact with the exposed portions of the first and second conducting areas; and etching the conducting layer so as to define individual electrical connections between each of the first conducting areas of the image sensor and corresponding one or more of the second conducting areas of the associated integrated circuit.

2. The process as claimed in claim 1, wherein the first and second substrates are bonded together by direct wafer bonding by molecular adhesion after the front sides of the first and second substrates have been planarized.

3. The process as claimed in claim 1, wherein at least one of the first conducting areas belongs to another conducting layer that also forms an external connection pad of the component.

4. The process as claimed in claim 1, wherein at least one of the first conducting areas and at least one of the one second conducting areas are electrically connected together and are also electrically connected to an external connection pad of the component.

5. The process as claimed in claim 4, wherein the connection pad comes into contact over most of its surface with the at least one of the first conducting areas.

6. The process as claimed in claim 4, wherein the external connection pad is laterally offset relative to the at least one of the first conducting areas.

7. The process as claimed in claim 1, further comprising:
depositing a passivation layer in the one or more openings after the etching of the semiconductor material.

8. The process as claimed in claim 1, wherein the formation of the one or more openings comprises forming two different openings separated laterally from each other.

9. The process as claimed in claim 1, wherein at least one of the first conducting areas belongs to another conducting layer that also forms an external connection pad of the component.

10. The process as claimed in claim 1, wherein at least one of the first conducting areas and at least one of the second conducting areas are electrically connected together and are also electrically connected to an external connection pad of the component.

11. The process as claimed in claim 10, wherein the connection pad comes into contact over most of its surface with the at least one of the first conducting areas.

12. The process as claimed in claim 10, wherein the external connection pad is laterally offset relative to the at least one of the first conducting areas.

13. The process as claimed in claim 1, wherein at least one of the first conducting areas is formed on a silicon island entirely isolated from the rest of the semiconductor material by a trench cut out all around the island over the entire thickness of the semiconductor material of the thinned first substrate.

14. The process as claimed in claim 1, wherein the image sensor on the thinned first substrate is configured to be illuminated via the backside of the thinned first substrate.

15. The process as claimed in claim 2, wherein at least one of the first conducting area belongs to another conducting layer that also forms an external connection pad of the component.

16. The process as claimed in claim 2, wherein at least one of the first conducting areas and at least one of the second areas are electrically connected together and are also electrically connected to an external connection pad of the component.

17. The process as claimed in claim 2, further comprising:
depositing a passivation layer in the one or more openings after the etching of the semiconductor material.

18. The process as claimed in claim 3, further comprising:
depositing a passivation layer in the one or more openings after the etching of the semiconductor material.

19. The process as claimed in claim 4, further comprising:
depositing a passivation layer in the one or more openings after the etching of the semiconductor material.

20. A process for fabricating an electronic component comprising an image sensor on a thinned substrate and an associated integrated circuit, said process comprising the following operations:
producing the image sensor from the front side of a first substrate made of semiconductor material, the sensor comprising first conducting areas arranged for establishing contacts with corresponding second conducting areas of the associated integrated circuit;
producing the associated integrated circuit, with the second conducting areas of the associated integrated circuit, on the front side of a second substrate, the second conducting areas of the second substrate being arranged not being covered by other conducting layers of the first or of the second substrate when the first and second substrates are superposed;
bonding the first and second substrates together front side to front side;
thinning the first substrate down to a thickness of about 2 to 30;
etching the semiconductor material of the thinned first substrate to form one or more openings, the one or more openings being over at least a portion of the first conducting areas and a portion of the second conducting areas;
depositing a passivation layer in the one or more openings;
removing at least a portion of insulating layers over the first conducting areas and the second conducting areas to at least partially expose the first conducting areas and the second conducting areas;
depositing a conducting layer that comes into contact with the exposed portions of the first and second conducting areas; and
etching the conducting layer so as to define individual electrical connections between each of the first conducting area of the image sensor and corresponding one or more of the second conducting areas of the associated integrated circuit.

* * * * *